United States Patent
Furukawa et al.

(10) Patent No.: US 7,535,016 B2
(45) Date of Patent: May 19, 2009

(54) VERTICAL CARBON NANOTUBE TRANSISTOR INTEGRATION

(75) Inventors: Toshiharu Furukawa, Essex Junction, VT (US); Mark C. Hakey, Fairfax, VT (US); David V. Horak, Essex Junction, VT (US); Charles W. Koburger, III, Delmar, NY (US); Mark E. Masters, Essex Junction, VT (US); Peter H. Mitchell, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/906,016

(22) Filed: Jan. 31, 2005

(65) Prior Publication Data

US 2006/0169972 A1   Aug. 3, 2006

(51) Int. Cl.
*H01L 29/15* (2006.01)
*H01L 51/30* (2006.01)

(52) U.S. Cl. ............... 257/20; 257/E51.04; 977/938

(58) Field of Classification Search .......... 257/77, 257/20, E21.629, E27.029, E51.04; 977/742, 977/938
See application file for complete search history.

(56) References Cited

U.S. PATENT DOCUMENTS

| | | | |
|---|---|---|---|
| 5,554,870 A * | 9/1996 | Fitch et al. | 257/334 |
| 6,130,470 A * | 10/2000 | Selcuk | 257/534 |
| 6,825,527 B2 * | 11/2004 | Sunami et al. | 257/321 |
| 6,830,981 B2 * | 12/2004 | Lee et al. | 438/309 |
| 7,161,218 B2 * | 1/2007 | Bertin et al. | 257/415 |
| 2001/0023986 A1 | 9/2001 | Mancevski | |
| 2002/0175390 A1 | 11/2002 | Goldstein et al. | |
| 2003/0098640 A1 | 5/2003 | Kishi et al. | |
| 2003/0134267 A1 | 7/2003 | Kang et al. | |
| 2003/0165418 A1 | 9/2003 | Ajayan et al. | |
| 2003/0168683 A1 | 9/2003 | Farnworth et al. | |
| 2003/0178617 A1 | 9/2003 | Appenzeller et al. | |
| 2003/0230782 A1 | 12/2003 | Choi et al. | |
| 2004/0004235 A1 | 1/2004 | Lee et al. | |
| 2004/0095837 A1 | 5/2004 | Choi et al. | |
| 2004/0120183 A1 | 6/2004 | Apenzeller et al. | |

OTHER PUBLICATIONS

S. Iijima, et al. "Helical Microtubes of Graphite Carbon", Nature 354, 56 (19991); D.S. Bethune, et al. "Cobalt Catalyzed Growth of Carbon Nanotubes with Single-Atomic-Layer Walls" Nature 363, 605 (1993).
R. Saito, et al. "Physical Properties of Carbon Nanotubes", Imperial College Press (1998); the entire content of each is incorporated herein by reference.

* cited by examiner

*Primary Examiner*—Lynne Gurley
*Assistant Examiner*—Colleen Matthews
(74) *Attorney, Agent, or Firm*—Scully, Scott, Murphy & Presser, P.C.; Richard M. Kotulak, Esq

(57) ABSTRACT

A hybrid semiconductor structure which includes a horizontal semiconductor device and a vertical carbon nanotube transistor, where the vertical carbon nanotube transistor and the horizontal semiconductor device have at least one shared node is provided. The at least one shared node can include, for example, a drain, source or gate electrode of a FET, or an emitter, collector, or base of a bipolar transistor.

20 Claims, 12 Drawing Sheets

VERTICAL CARBON NANOTUBE TRANSISTOR INTEGRATION

FIELD OF THE INVENTION

The present invention relates to a semiconductor structure and to a method of fabricating the same. More particularly, the present invention relates to a hybrid semiconductor structure which includes a vertical carbon nanotube transistor and a horizontal semiconductor device where the carbon nanotube transistor and the horizontal semiconductor device have at least one shared node, i.e., terminal, and a method of forming the hybrid semiconductor structure.

BACKGROUND OF THE INVENTION

In the field of molecular electronics, few materials show as much promise as carbon nanotubes that comprise hollow cylinders of graphite that have a diameter of a few Angstroms. Nanotubes can be implemented in electronic devices, such as, for example, diodes and transistors, depending on the nanotube characteristics. Nanotubes are unique for their size, shape and physical properties. For example, carbon based nanotubes resemble a hexagonal lattice of carbon rolled into a cylinder.

Besides exhibiting intriguing quantum behaviors even at room temperature, nanotubes exhibit at least two important characteristics; a nanotube can be either metallic or semiconducting depending on its chirality, i.e., conformational geometry. Metallic nanotubes can carry an extremely large current density with constant resistivity. Semiconducting nanotubes can be electrically switched "on" or "off" as field effect transistors (FETs). The two types may be covalently joined (i.e., sharing electrons). These characteristics point to nanotubes as excellent materials for making nanometer sized semiconductor circuits.

Carbon based nanotubes are thus becoming strategically important for post-scaling of conventional semiconductor technologies. For example, the inclusion of pFET devices within an nFET, CMOS, or BiCMOS process requires providing an n-well to place the pFET. A pFET device, like its nFET counterpart, is typically formed with a lateral source-body-drain arrangement. Drawbacks in such technologies include pFET device performance lagging the nFET due to lower mobility and separation requirements between the nFET and the pFET due to necessary well boundaries.

Additionally, SRAM cell pFET load devices have been formed in polysilicon layers over the SRAM nFET. However, pFET device performance and process complexities to form the polysilicon level to form the pFET are drawbacks in such logic devices.

In view of the drawbacks mentioned above with prior art semiconductor structures, there is a need to provide a hybrid semiconductor structure including a horizontal semiconductor device in which a vertical carbon nanotube transistor has been integrated therein improving the performance of the structure, while shrinking the overall size of the structure.

SUMMARY OF THE INVENTION

The present invention overcomes the drawbacks with prior art semiconductor devices including logic gates by integrating a vertical carbon nanotube transistor with a horizontal semiconductor device such as a FET or bipolar transistor in which the carbon nanotube transistor and the horizontal semiconductor device have at least one common, i.e., shared, node. The term "node" is used in the present invention to denote any terminal of a horizontal semiconductor device such as a source, drain or a gate of a FET, or an emitter, collector or base of a bipolar transistor. The hybrid semiconductor structures of the present invention exhibit the performance enhancement of vertical carbon nanotube transistors over comparably sized Si-based devices. Moreover, the inventive structures have improved packing density as compared with conventional Si-based devices.

In broad terms, the present invention thus provides a hybrid semiconductor structure which comprises at least one horizontal semiconductor device and at least one vertical carbon nanotube transistor, wherein said at least one vertical carbon nanotube transistor and the at least one horizontal semiconductor device have at least one shared node.

In some embodiments of the present invention, the at least one horizontal semiconductor device is a FET of a first conductivity type (p or n, preferably n) and the at least one vertical carbon nanotube transistor is of a second conductivity type, that is opposite to the first conductivity type (p or n, preferably p). In this embodiment, the vertical carbon nanotube transistor and the horizontal FET have at least a shared source, drain or gate.

DETAILED DESCRIPTION OF THE INVENTION

The present invention, which provides a hybrid semiconductor structure including at least one vertical carbon nanotube transistor and at least one horizontal semiconductor device as well as a method of fabricating the same, will now be described in greater detail by referring to the accompanying drawings.

It is noted that the drawings of the present invention illustrate one possible embodiment in which the horizontal semiconductor device is a FET. Although such an embodiment is described and illustrated in detail, the present invention also contemplates other embodiments in which other horizontal semiconductor devices such as bipolar transistors, double-gated devices, diodes, capacitors, resistors and the like are used in place of the horizontal FET. The horizontal semiconductor devices can include a combination of devices such as, for example, a combination of a bipolar device and a FET device. In cases in which other horizontal semiconductor devices are used, the basic processing steps described below in forming the inventive structure can be used such that the carbon nanotube transistor and the other horizontal semiconductor device have at least one common, i.e., shared node.

It is also noted that the drawings of the present invention are provided for illustrative purposes and thus the same are not drawn to scale. Moreover, where a single vertical carbon nanotube transistor and a single horizontal FET are shown and illustrated, the present invention also works when a plurality of such transistors are present.

Figure 1:
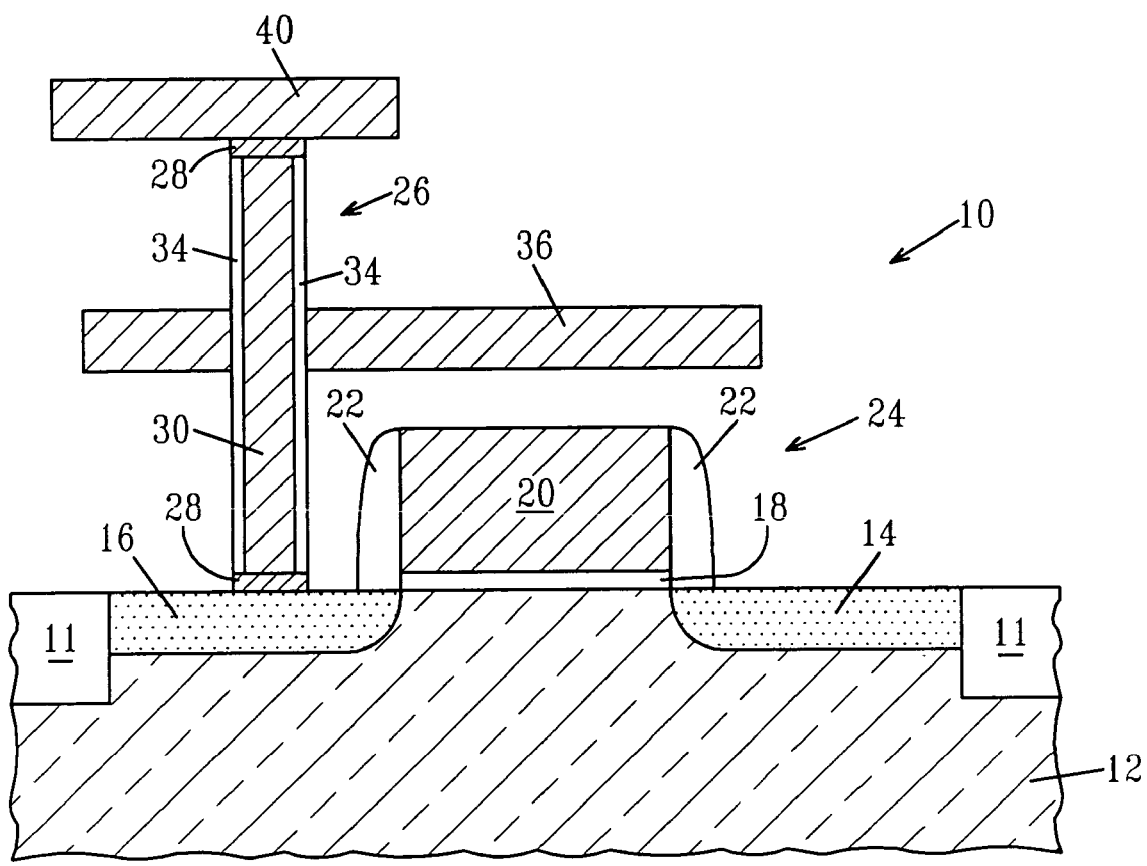
FIG. 1 is a pictorial representation (through a cross sectional view) illustrating one possible embodiment of the present invention in which a horizontal FET device and a vertical carbon nanotube transistor have a shared drain. In this drawing, the various interlevel dielectrics have been omitted for clarity.

Reference is first made to FIG. 1 which is a cross sectional view of one possible hybrid semiconductor structure 10 of the present invention. The inventive hybrid semiconductor structure 10 of FIG. 1 comprises at least one horizontal FET device 24 and at least one vertical carbon nanotube transistor 26 in which the vertical carbon nanotube transistor 26 and the horizontal FET device 24 have a shared drain 16. The other reference numerals included within FIG. 1 will be described in greater detail by referring to the processing flow that is depicted in FIGS. 2A-2G. It is noted that although the vertical carbon nanotube transistor 26 and the horizontal semiconductor FET device 24 are shown as having a shared drain 16, the present invention also contemplates embodiments, in which the two devices 24 and 26 share a gate, or a source, with or without the drain.

The process flow for fabricating the hybrid semiconductor structure 10 shown in FIG. 1 begins with first providing a horizontal FET device 24 on a surface of a semiconductor substrate 12. See FIG. 2A. As shown, the horizontal FET device 24 includes a drain 16, a source 14, a gate dielectric 18, a gate electrode 20 and at least one spacer 22. The horizontal FET device 24 is formed utilizing any conventional CMOS process that is well known to those skilled in the art. Briefly, one possible CMOS process that can be used in forming the horizontal FET device 24 includes first providing a stack comprising the gate dielectric 18 and the gate electrode 20 on a surface of the semiconductor substrate 12. The stack is patterned via lithography and etching and then the at least one spacer 22 is formed on exposed sidewalls of at least the gate electrode 20 by deposition and etching. The source and drain, 14 and 16, respectively, are then formed via ion implantation and annealing.

The various components of the horizontal FET device 24 are comprised of conventional materials that are well known to those skilled in the art. For example, the semiconductor substrate 12 includes a semiconductor material such as Si, SiGe, SiC, SiGeC, InAs, InP, GaAs, a silicon-on-insulator, a silicon germanium-on-insulator or other like semiconductor materials. Preferably, the semiconductor substrate 12 includes a Si-containing semiconductor material such as Si.

Figure 2A:
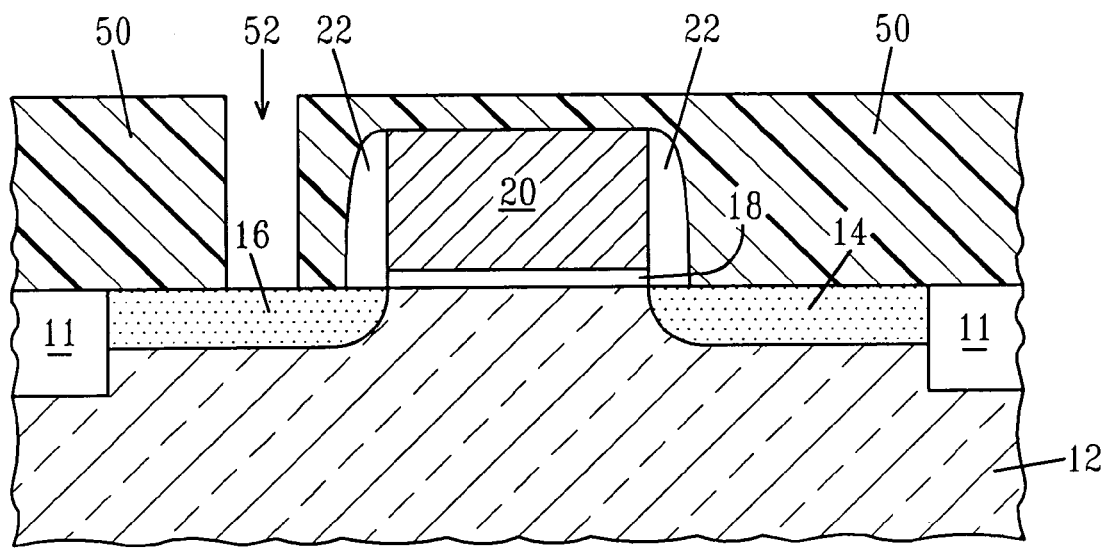
FIG. 2A-2G are pictorial representations (through cross sectional views) illustrating the basic processing steps that are employed in fabricating the hybrid semiconductor structure of FIG. 1. In the process flow illustrated, the various interlevel dielectrics are shown.
Figure 2B:
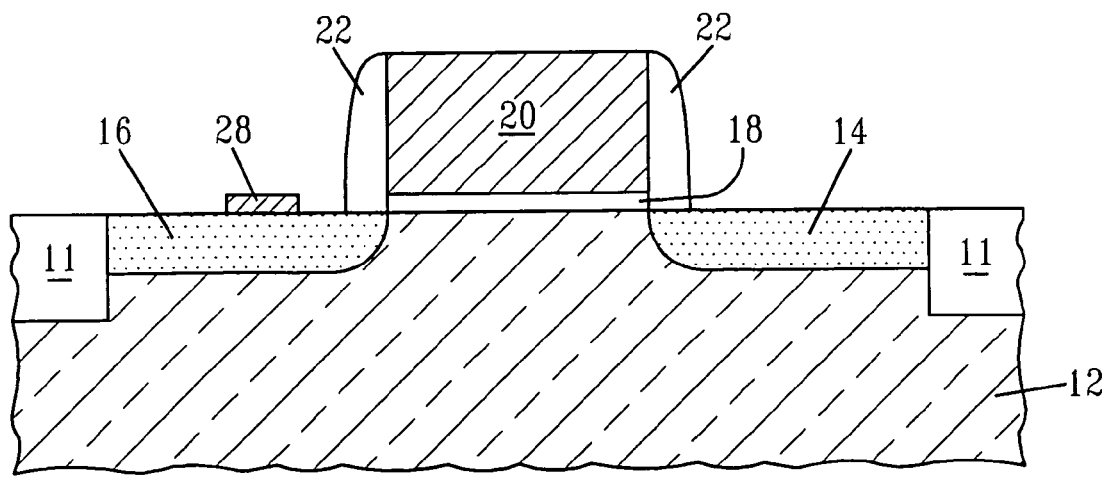

The semiconductor substrate 12, as shown in FIG. 2A, may include device isolation regions 11 such as trench isolation regions or field oxide isolation regions that are fabricated by a conventional process including lithography to define an opening for a trench, etching to define the trench in the substrate, and trench fill. The trench isolation regions 11 are typically comprised of a trench dielectric material such as an oxide.

The gate dielectric 18 is comprised of an oxide, nitride, oxynitride, metal oxide or a combination, including multilayers thereof. Preferably, the gate dielectric is an oxide such as $SiO_2$. The gate electrode 20 is comprised of a conductive material such as polySi, SiGe, a metal, a metal alloy, a metal silicide, a metal nitride or combinations, including multilayers thereof. A diffusion barrier, not shown, such as TiN or TaN can be located between multilayers of conductive material. Also, a capping layer, not shown, such as an oxide or nitride, can located atop the gate electrode 20. The at least one spacer 22 comprises an oxide, nitride, oxynitride or any combination thereof including multilayers.

In one embodiment, the at least horizontal FET device 24 is an nFET. In another embodiment, the least one horizontal FET device 24 is a pFET. It is noted that the vertical carbon nanotube transistor 26 that is formed in each of these embodiments will typically have the opposite conductivity type of the horizontal FET, i.e., p-type vertical carbon nanotube transistor with the nFET device 24, and n-type vertical carbon nanotube transistor with the pFET device 24.

Although not shown, the drain, source and gate electrode can be silicided utilizing a conventional silicidation process at this point of the present invention. In FIG. 2A, drain 16, source 14 and gate electrode 20 are the terminals of the FET device 24.

After providing the at least one horizontal FET device 24 shown in FIG. 2A, a mask 50 having at least one opening 52 is formed by lithography. In some embodiments of the present invention, the at least one opening 52 exposes a surface of the drain 16 of the horizontal FET device 24. In yet another embodiment, the at least one opening 52 exposes a surface of the gate, the source or a combination thereof, with or without the drain 16. The mask 50 is comprised of a conventional photoresist material or a dielectric material. In broad terms, the at least one opening 52 exposes at least one of the terminals (i.e., the source, drain or gate) of the horizontal FET device 24. The lithography step includes exposing the photoresist to a pattern of radiation and developing the pattern utilizing a resist developer. The structure is also shown in FIG. 2A as well.

After forming the structure shown in FIG. 2A, a catalyst 28 for the growth of a vertical carbon nanotube 26 is formed on the exposed terminal surface of the horizontal FET device 24. Typically, mask 50 having the at least one opening 52 remains during the formation of the catalyst 28 and is removed after formation of the catalyst in a lift-off technique, removing the catalyst material otherwise deposited on the mask 50. The structure including the catalyst 28 located on one of the exposed terminals of the horizontal FET device 24, e.g., the drain 16, is shown, for example, in FIG. 2B.

The catalyst 28 is formed utilizing a conventional deposition process such as chemical vapor deposition (CVD), plasma enhanced chemical vapor deposition (PECVD) sputtering, plating, and other like deposition processes. The catalyst 28 comprises a Group VIII transistor metal such as Co or Fe, or alloys thereof. The catalyst 28 formed over the exposed terminal, e.g., the drain 16, has a thickness that is typically from about 5 to about 100 nm.

The catalyst 28 serves to define the location, diameter and possibly other attributes of the vertical carbon nanotube. The catalyst 28 will also insure that an ohmic (rather than a diodic) connection is made to the terminal shared with the horizontal FET device 24, although the use of silicided diffusions will likely provide the ohmic contact. It should be noted however that the catalyst 28 may form a Schottky diode with the grown carbon nanotube, an attributed believed to be typical of most carbon nanotubes formed in the current art.

Figure 2C:
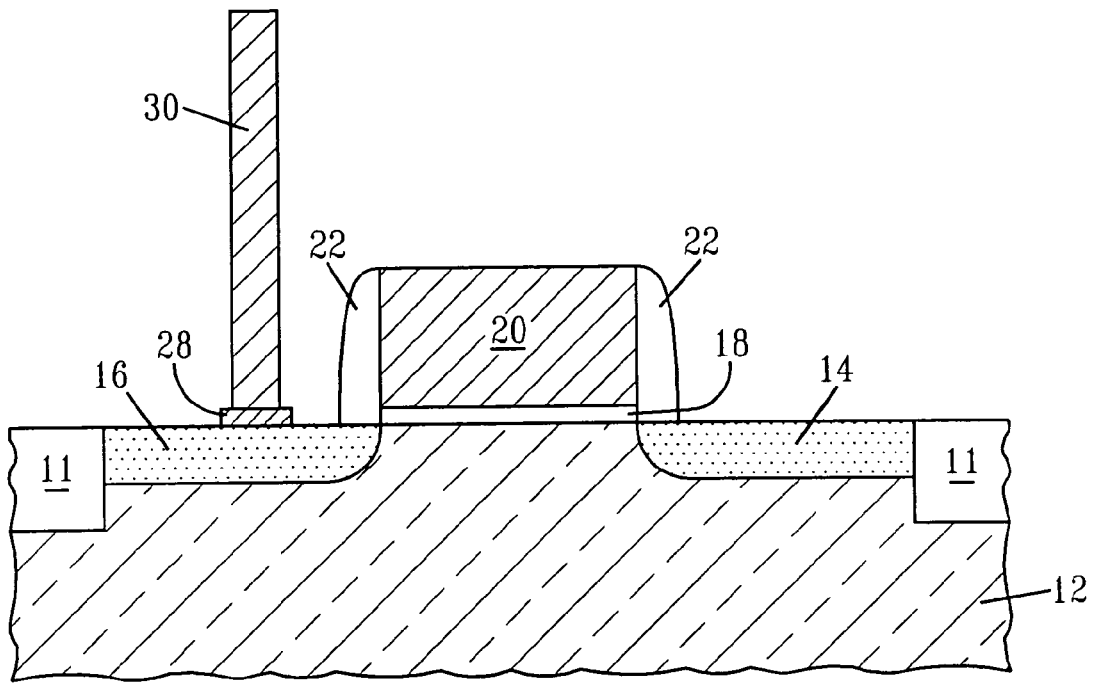
Figure 2D:
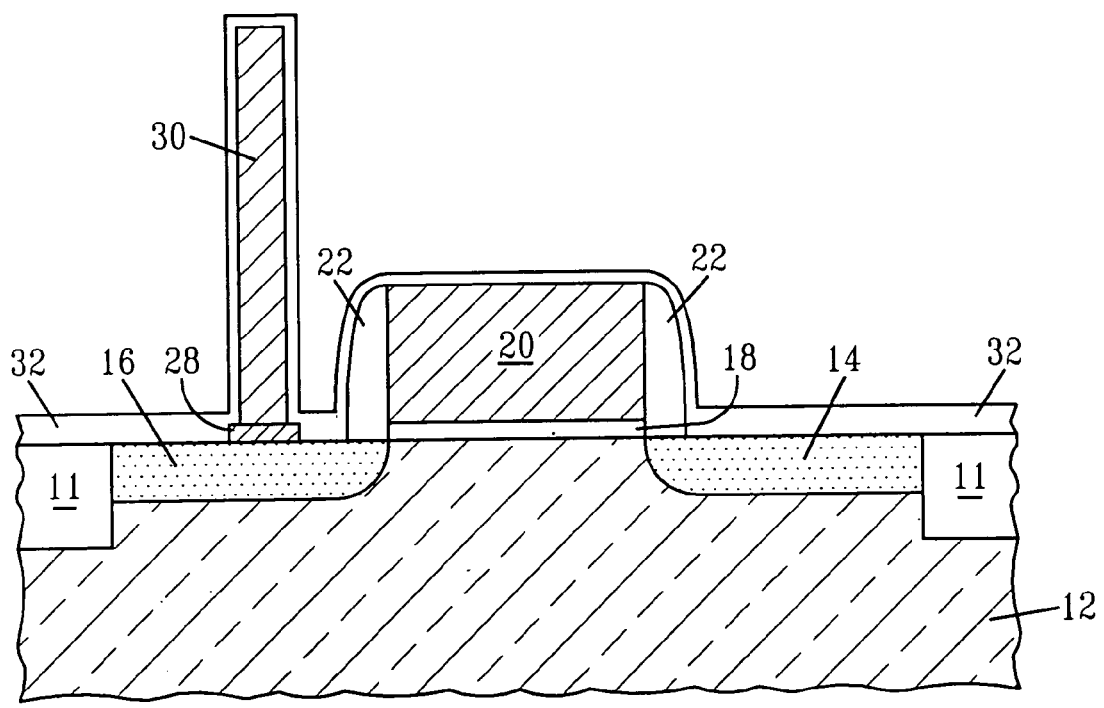
Figure 2E:
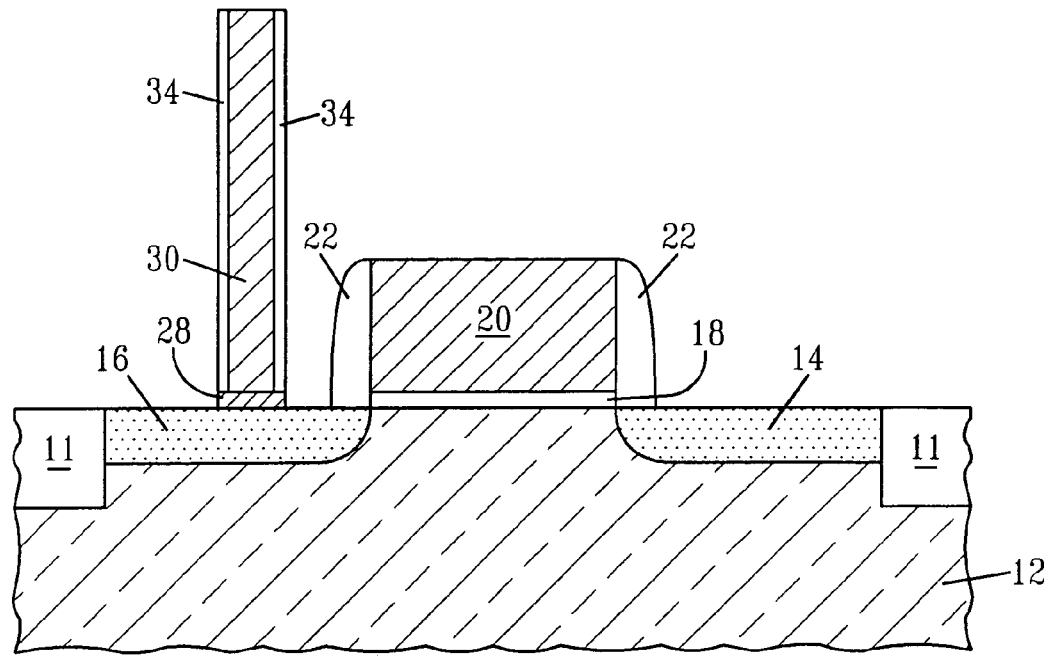

FIG. 2C shows the structure after at least one carbon nanotube 30 has been grown vertically from the catalyst 28 surface using techniques that are well known in the art. Each carbon nanotube 30 that is formed has a hollow cavity with nanometer-sized diameters and much, much longer lengths. In other words, the nanotubes 30 have a high aspect ratio and quantum effects become important for these systems.

The nanotubes 30 that can be used in the present invention are single walled or multi-walled nanomaterials that have an outer diameter that is typically from about 0.8 nm to about 30 nm, with an outer diameter from about 1.0 nm to about 2.5 nm being more typical, and a length that is typically from about 5 nm to about 100 μm, with a length from about 10 nm to about 10 μm being more typical. In addition to having an outer diameter, the nanotubes 30 that can be used in the present invention have an inner diameter that is typically from about 0.8 nm to about 15 nm, with an inner diameter from about 0.8 nm to about 2.5 nm being more highly typical. The nanotubes 30 useful in the present invention are further characterized as having a high aspect ratio that is typically on the order of about 5 or greater, with an aspect ratio from about 5 to about 5000 being typical. In some embodiments, a rope of carbon nanotubes 30 is vertically formed from the catalyst 28 surface.

Each nanotube 30 formed includes a C-based nanomaterial that has a hexagonal lattice structure that is rolled up. That is, the nanotubes 30 of the present invention typically are comprised of carbon, e.g., graphite. Although C-based nanomaterials are preferably used, the present invention also contemplates other types of nanomaterials such as a combination of C-based and metallic or varying combinations along the length of the nanotube.

Although it is possible to form a single nanotube 30, preferably a plurality of nanotubes 30 are formed which form a layer of one-dimensional nanostructures having a varying thickness that is dependent on the technique that was used to form the same. Typically, the layer of one-dimensional nanostructures has a thickness from about 0.4 to about 50 nm, with a thickness from about 0.8 to about 5 nm being more typical.

As indicated above, the nanotubes 30 are formed utilizing techniques that are well known in the art. For example, carbon-based nanotubes 30 can be made by chemical vapor deposition in the presence of metallic particles, e.g., the catalyst previously formed on the exposed terminal surface of the horizontal FET device 24. Specific process details for nanotube 30 formation that can be used in the present invention can be found, for example, in S. Iijima, et al. "Helical Microtubes of Graphite Carbon", Nature 354, 56 (19991); D. S. Bethune, et al. "Cobalt Catalyzed Growth of Carbon Nanotubes with Single-Atomic-Layer Walls" Nature 363, 605 (1993), and R. Saito, et al. "Physical Properties of Carbon Nanotubes", Imperial College Press (1998); the entire content of each is incorporated herein by reference. In one embodiment of the present invention, a layer of carbon nanotubes 30 is formed by chemical vapor deposition at 900° C. for 10 min using an Fe catalyst.

In some embodiments, the subsequent carbon nanotube transistor (CNT) is a pFET. In other embodiments, the CNT is formed into a nFET by subjecting the CNT to an annealing step that is capable of removing oxygen from the CNT. The annealing step, which is capable of removing oxygen from the CNT, is typically performed in a heated vacuum (IEEE Proceedings, Avouris, November 2003 p. 1780). Alternatively, a nFET CNT can be made by adding a donor such as with a potassium vapor. It is noted that the carbon nanotube 30 is the gate of the CNT device.

A first dielectric 32 (See, FIG. 2D) is then formed around a lower portion of the layer of vertical carbon nanotubes 30 to insulate it from the rest of the horizontal FET device 24 and to form a drain region of what will become the CNT. This dielectric (i.e., first dielectric 32) is typically comprised of an organic or inorganic dielectric, including, for example, an organosilicate glass, fluorinated $SiO_2$ or carbon-doped glass. The thickness of this dielectric is typically from about 1.0 to about 100 nm, and a deposition process, such as chemical vapor deposition or plasma enhanced chemical vapor deposition, is used to form the same. The dielectric 32 is then cleaned from the sidewalls of each of the carbon nanotubes 30. In the remaining drawings, dielectric 32 is not shown for clarity.

A gate dielectric 34 for the CNT (See, FIG. 2E) is then formed on the exposed sidewalls of the carbon nanotubes 30 to form the field region used to control the conductivity of the CNT. The gate dielectric 34 can be formed by a deposition process such as, for example, chemical vapor deposition (CVD), plasma-assisted CVD, atomic layer deposition (ALD), evaporation, reactive sputtering, chemical solution deposition or other like deposition processes. The gate dielectric 34 may also be formed utilizing any combination of the above processes.

The CNT gate dielectric 34 is comprised of an insulating material including, but not limited to: an oxide, nitride, oxynitride and/or silicate including metal silicates and nitrided metal silicates. In one embodiment, it is preferred that the CNT gate dielectric 34 is comprised of an oxide such as, for example, $SiO_2$, $HfO_2$, $ZrO_2$, $Al_2O_3$, $TiO_2$, $La_2O_3$, $SrTiO_3$, $LaAlO_3$ or mixtures thereof.

The physical thickness of the CNT gate dielectric 34 may vary, but typically, the CNT gate dielectric 34 has a thickness from about 0.5 to about 100 nm, with a thickness from about 1.0 to about 10 nm being more typical.

Figure 2F:
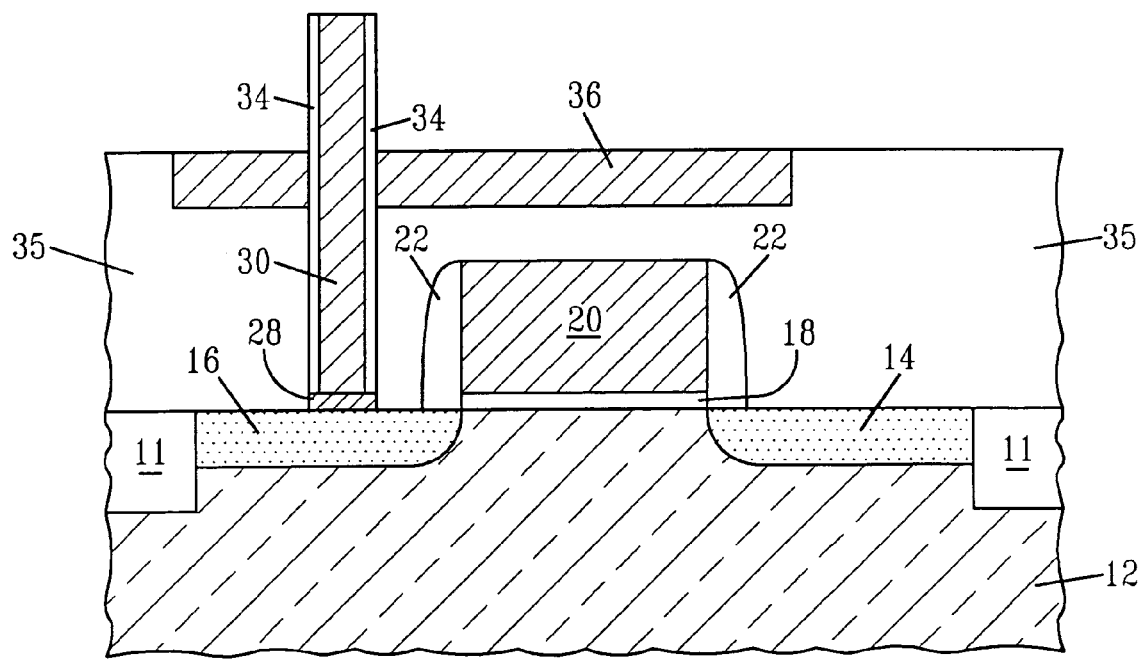
Figure 2G:
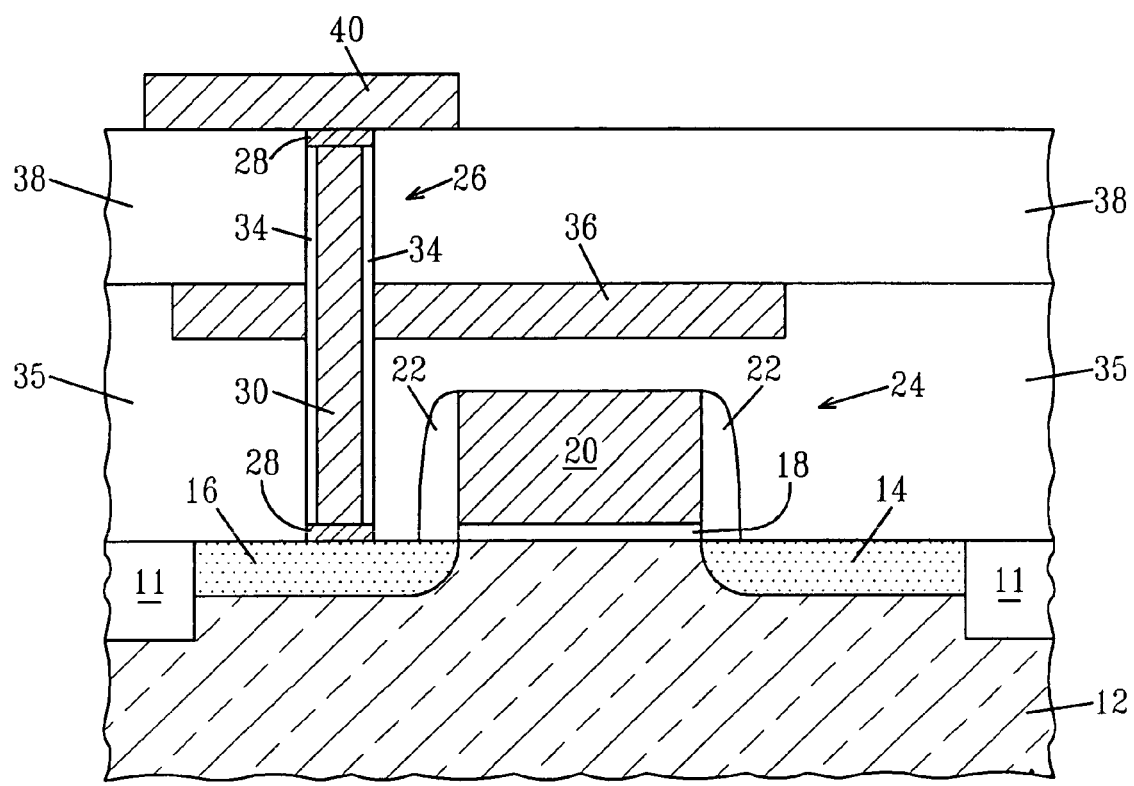

A first gate electrode 36 is then formed within the first level, i.e., within a first interlevel dielectric 35, utilizing techniques that are well known to those skilled in the art. The resultant structure including the first gate electrode 36 and first interlevel dielectric 35 is shown in FIG. 2F. The first interlevel dielectric 35 is comprised of any organic or inorganic dielectric material. The gate electrode 36 is comprised of at least one conductive material including, for example, a conductive metal, a conductive metal alloy, a conductive silicide or a conductive nitride. In one embodiment of the present invention, the gate electrode 36 is comprised of a conductive metal such as Cu, W or Al. The gate electrode 36 is typically formed by deposition and patterning. The deposition process includes a conventional deposition such as chemical vapor deposition, sputtering, plating, evaporation and the like and the patterning step includes lithography and etching or a damascene process utilizing CMP. See FIG. 2F.

A second interlevel dielectric 38 (See, FIG. 2G) is then formed over the first gate electrode 36 and atop the first interlevel dielectric 35 to insulate it from what will become the third terminal of the vertical gate, the source. The second interlevel dielectric 38 may be comprised of the same or different dielectric as the first interlevel dielectric 32.

With height variations of the carbon nanotubes protruding through interlevel dielectric 38, a polish is used to shear the protruding nanotubes and planarize the structure to the top of dielectric 38.

A second gate electrode 40 (See, FIG. 2G) is then formed at the top of the carbon nanotube structure and a contact is made between them to form the source terminal of the vertical carbon nanotube transistor. The second gate electrode 40 may be comprised of the same or different conductive material as the first gate electrode 36.

Figure 3:
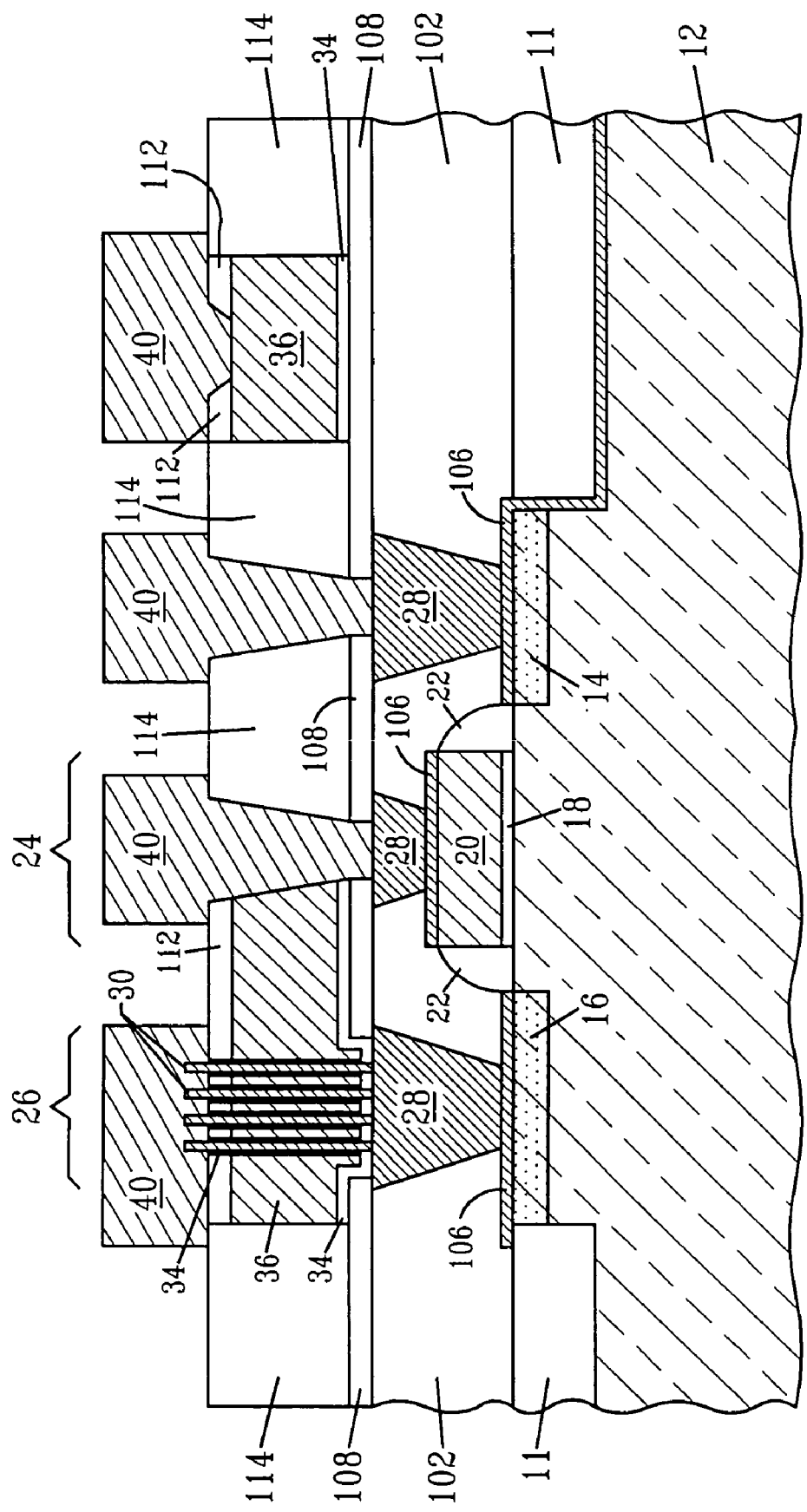
FIG. 3 is a pictorial representation (through a cross sectional view) illustrating one possible embodiment of the present invention in which a horizontal FET device and a vertical carbon nanotube transistor have a shared drain and gate.

In yet another embodiment of the present invention a CNT 26 integrated with a horizontal FET 24 having a shared drain and gate is provided. This structure is shown in FIG. 3. The various elements labeled in the drawing will be defined hereinbelow in describing the processing steps that are used to form the hybrid structure shown in FIG. 3.

Figure 4A:
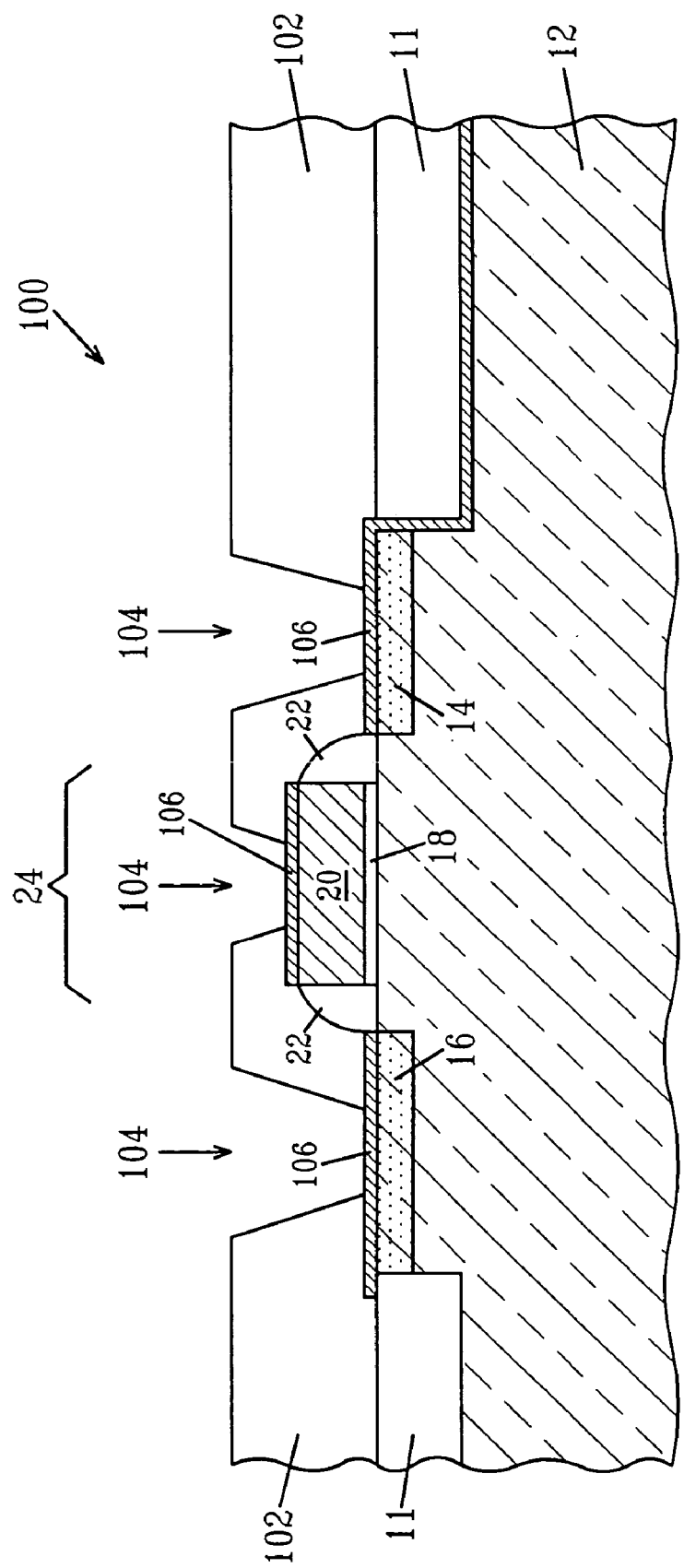
FIGS. 4A-4F are pictorial representations (through cross sectional views) illustrating the basic processing steps that are employed in fabricating the hybrid semiconductor structure of FIG. 3.

FIG. 4A shows an initial structure 100 that is used in forming the structure shown in FIG. 3. The initial structure 100 includes a semiconductor substrate 12 having trench isolation regions 11, source region 14 and drain region 16 located therein. Atop of the substrate 12 there is shown the presence of at least one horizontal FET 24 including a gate dielectric 18, a gate electrode 20 and sidewall spacers 22. A patterned first dielectric 102 is formed over the entire surface of the substrate 12 including the at least one horizontal FET 24. The first dielectric 102 is comprised of an interlevel dielectric material such as an organosilicate glass, silicon nitride, or $SiO_2$. The patterned dielectric 102 has openings 104 which expose the source 14, drain 16 and gate electrode 20. Note that in the embodiment illustrated these surfaces have been silicided; reference numeral 106 denotes the silicided surfaces of the source 14, drain 16, and gate electrode 20.

Figure 4B:
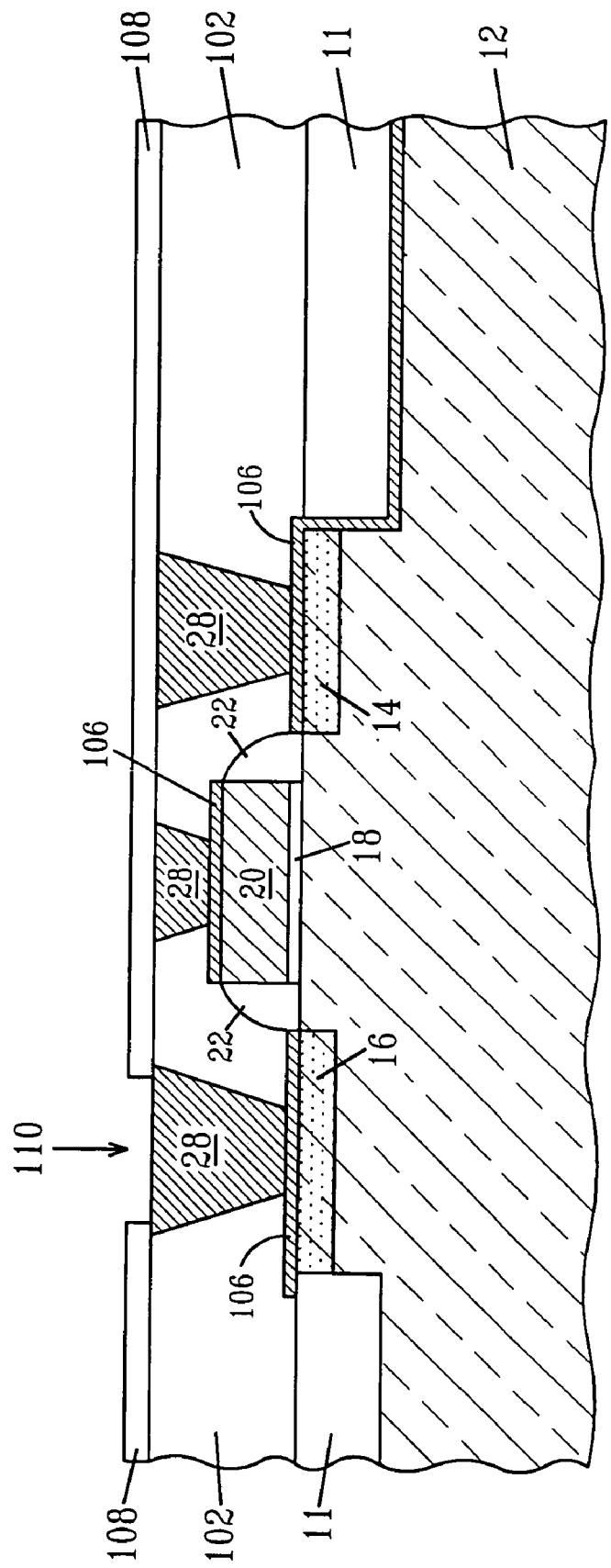

The structure shown in FIG. 4A is formed utilizing conventional processing steps that are well known to those skilled in the art of CMOS device fabrication. The contact openings 104 within the patterned dielectric 102 are formed by lithography and etching as is known to those skilled in the art of interconnect technology. The contact openings 104 shown in FIG. 4A are then filled with a conductive material 28 which also serves as the catalyst for subsequent carbon nanotube growth. The conductive material 28 which may comprise Fe or Co, or Ni for example, is formed by a deposition process such as chemical vapor deposition, sputtering, evaporation, platting, or plasma enhanced chemical vapor deposition. After deposition of the conductive material 28, i.e., nanotube catalyst, a conventional planarization process such as chemical mechanical polishing (CMP) is then used to provide a surface in which the conductive material 28 is coplanar with the patterned dielectric material 102. A second dielectric 108 such as an oxide is then applied and patterned to having an opening 110 to the conductive material 28 that is located atop the drain 16. The resultant structure that is formed after performing these steps is shown in FIG. 4B.

Figure 4C:
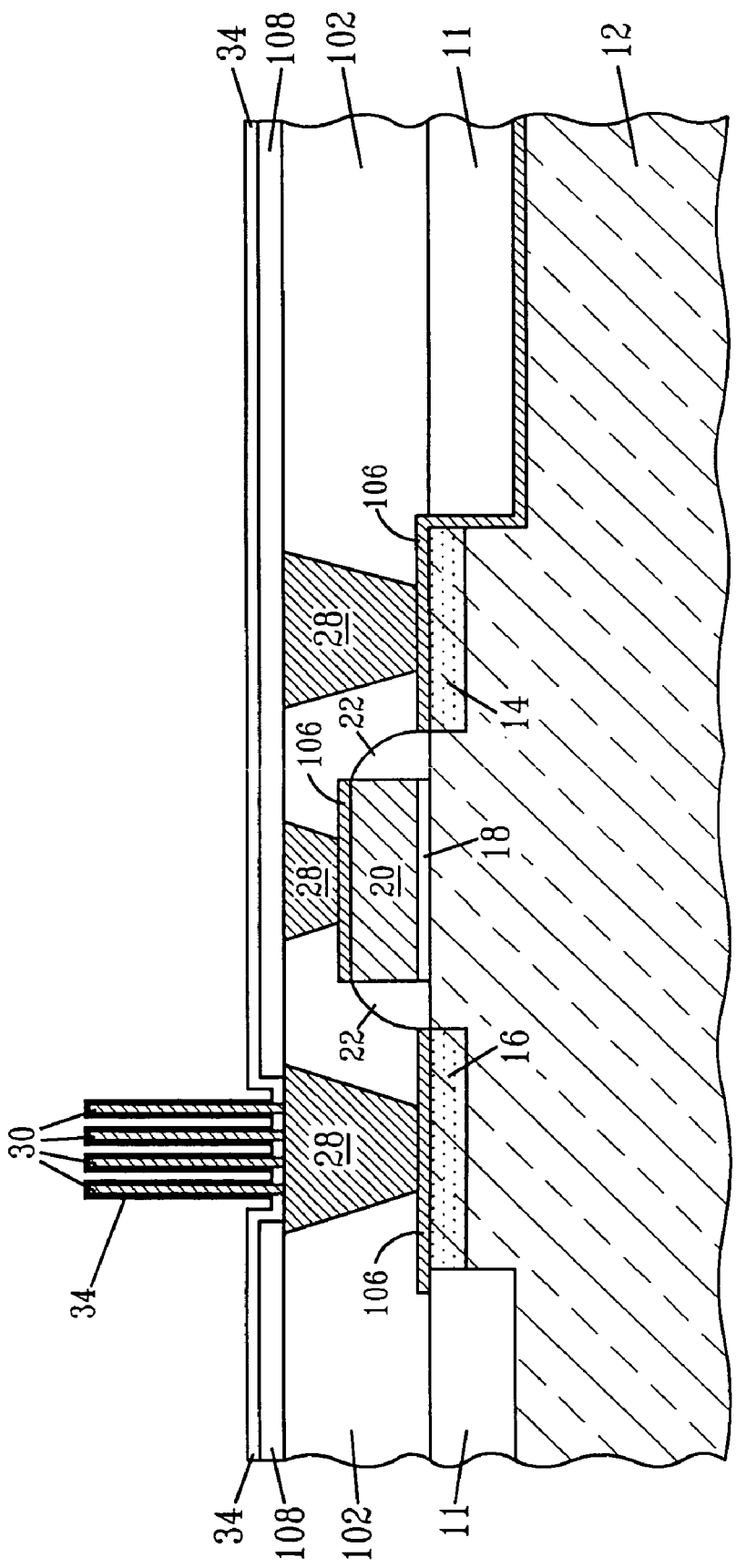
Figure 4D:
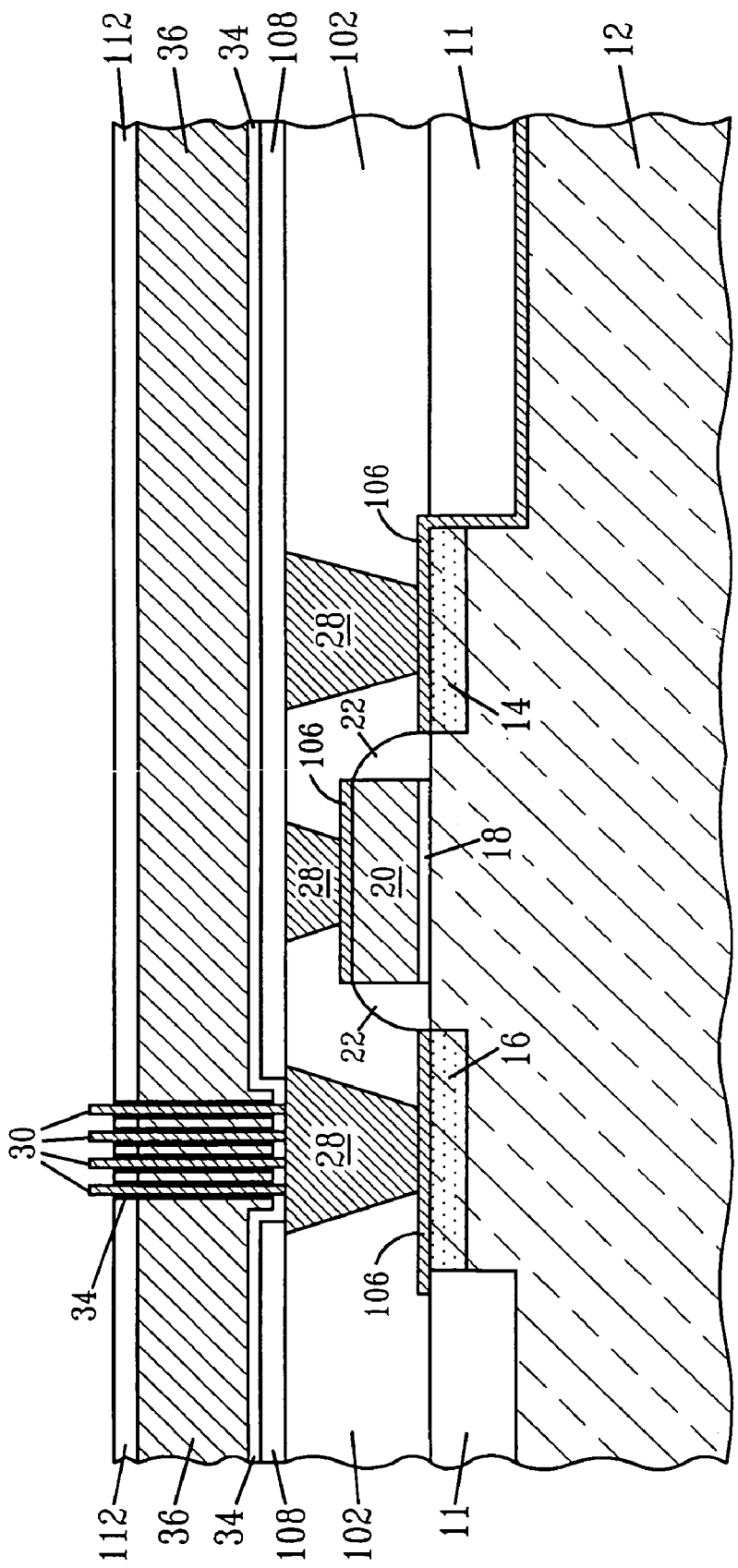

Carbon nanotubes 30 are formed as described above and a CNT gate dielectric 34 is then formed to provide the structure shown in FIG. 4C. Specifically, and as shown in FIG. 4C, a first gate electrode 36 such as W, Co, or Al is formed by deposition so as to cover the gate dielectric encapsulated carbon nanotubes. A third dielectric 112 such as an oxide is then formed and the structure is subjected to CMP so as to shear all carbon nanotubes to the same height. This structure is shown in FIG. 4D.

Figure 4E:
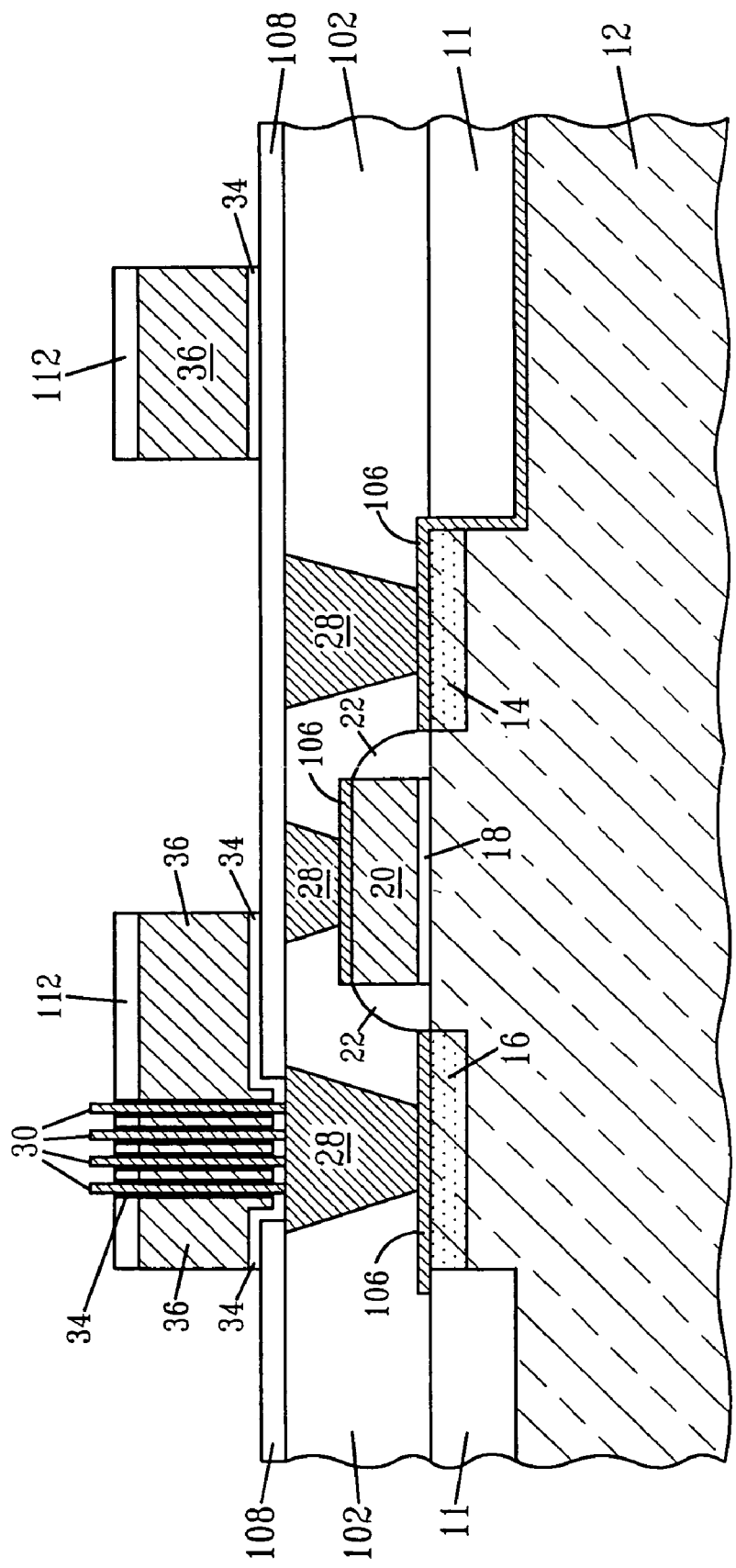
Figure 4F:
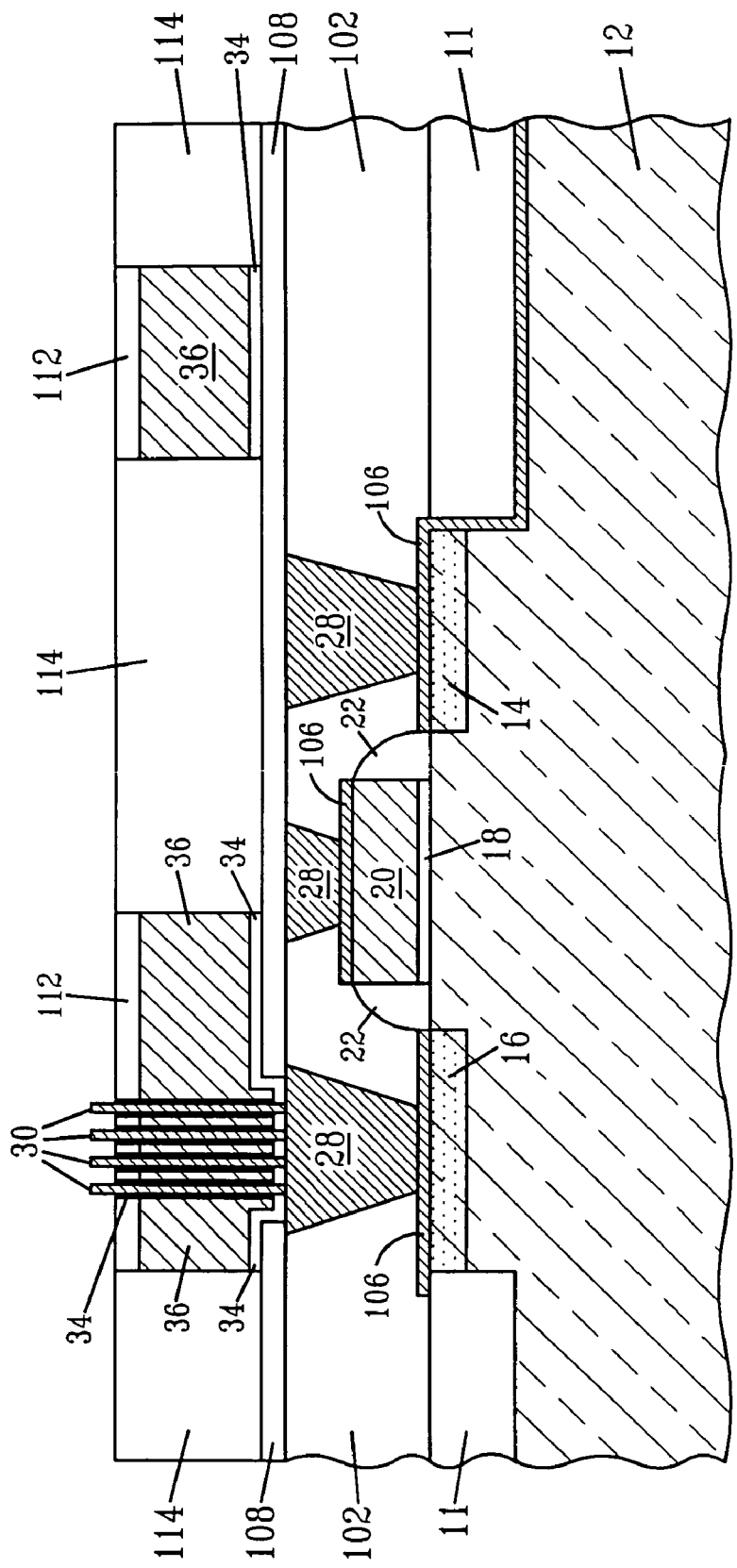

The third dielectric 112 and the first gate electrode 36 are then patterned by lithography and etching to form the structure shown in FIG. 4E. Note that at least two patterned stacks are typically formed in this step of the present invention. The spaces between the patterned stacks are then filled with a fourth dielectric 114 such as an oxide and the structure is then subjected to a CMP process to provide the structure shown, for example, in FIG. 4F.

A via opening is then formed through the second dielectric 108, the gate dielectric 34 and the fourth dielectric 114 stopping on either the first gate electrode 36 or the catalyst 28. A conductor 40 is deposited, filling the via openings and establishing continuity between the first gate electrode 36 and conductor 28 to the gate of the horizontal gate. The structure is then subjected to a recess etching step in which the top surfaces of ends of the carbon nanotubes 30 are exposed and thereafter a source electrode 40 for the vertical CNT is deposited and annealed to provide the structure shown, for example, in FIG. 3.

In this embodiment, the devices (CNT and FET) share the same gate conductor thus providing for an inverter or the component for logic gates where an nFET and a pFET share a common drain node as well as a common gate such as in commonly used NAND and NOR circuits. Similarly, the shared drain and shared gate arrangement lends itself to the formation of new SRAM cell designs having a size advantage over conventional SRAM cells. This is shown, for example, by the following table:

| Type | Ground Rule (μm) | Cell Area (μm$^2$) | # Squares |
|---|---|---|---|
| Prior Art Base 6 Transistor | 0.25 | 12.0 | 192 |
| Prior Art Base 6 Transistor | 0.13 | 2.48 | 147 |
| Prior Art Dense 6 Transistor | 0.13 | 2.0 | 118 |
| Prior Art 4 Transistor Resistor | 0.30 | 6.3 | 70 |
| Invention CNT Hybrid 1 | N/A | N/A | 56 |
| Invention CNT Hybrid 2 | N/A | N/A | 48 |

The results shown in this table illustrate that the inventive SRAM cells containing the vertical CNT have one-third the size of a conventional SRAM cell.

In another embodiment of the present invention, the CNT 26 and the horizontal FET 24 have a shared gate without the shared drain. This embodiment begins by first providing the structure similar to that shown in FIG. 4C, without the shared drain. The process for forming a shared gate described above for the shared gate and shared drain structure is practiced. In this manner, the horizontal FET and the vertical CNT can share the same gate node, but have independent source and drain nodes.

Additionally, rather than a single conductor used for the vertical CNT gate electrode, multiple conductors can be placed to offer additional gating logic to the vertical CNT or CNTs, either on the same level (providing an "OR" function) or on successful levels (providing an "AND" function). Still another embodiment of the present invention would be the sharing of nodes between multiple lateral nFETS and pFETS that be formed along the single vertical CNT structure.

It is also noted that although the above description is for a vertical CNT integrated with a FET having at least one common source, drain or gate, the FET can be replaced with a bipolar device and sharing can be between one of the emitter, collector, or base of the bipolar transistor. Similarly, nodes may be shared with other active or passive semiconductor elements or with new structures such as FinFETs.

While the present invention has been particularly shown and described with respect to preferred embodiments thereof, it will be understood by those skilled in the art that the foregoing and other changes in forms and details may be made without departing from the scope and spirit of the present invention. It is therefore intended that the present invention not be limited to the exact forms and details described and illustrated, but fall within the scope of the appended claims.

What is claimed is:

1. A hybrid semiconductor structure comprising:
   at least one horizontal semiconductor device and at least one vertical carbon nanotube transistor including at least one vertically grown carbon nanotube, a first horizontally oriented gate electrode located within a first interlevel dielectric and a second horizontally oriented gate electrode in contact with an upper portion of the at least one vertically grown carbon nanotube and located atop a second interlevel dielectric which is located atop said first interlevel dielectric, wherein said at least one vertical carbon nanotube transistor and the at least one horizontal semiconductor device have at least one shared node and are both located directly on a same surface of a common planar substrate.

2. The hybrid semiconductor structure of claim 1 wherein said at least one shared node is a drain, source or gate electrode of said at least one horizontal semiconductor device.

3. The hybrid semiconductor structure of claim 2 wherein said at least one shared node is the drain of said at least one horizontal semiconductor device.

4. The hybrid semiconductor structure of claim 2 wherein said at least one shared node is the gate electrode of said at least one horizontal semiconductor device.

5. The hybrid semiconductor structure of claim 2 wherein said at least one shared node comprises the drain and said gate electrode of said at least one horizontal semiconductor device.

6. The hybrid semiconductor structure of claim 1 wherein said at least one horizontal semiconductor device is a field effect transistor (FET), a bipolar transistor, a double gate transistor, a diode, a capacitor, a resistor or any combination thereof.

7. The hybrid semiconductor structure of claim 6 wherein said at least one horizontal semiconductor device is a FET.

8. The hybrid semiconductor structure of claim 7 wherein said FET is a pFET and said at least one vertical carbon nanotube transistor is an n-type transistor.

9. The hybrid semiconductor structure of claim 7 wherein said FET is an nFET and said at least one vertical carbon nanotube transistor is a p-type transistor.

10. The hybrid semiconductor structure of claim 1 wherein said at least one vertical carbon nanotube transistor further comprises a gate dielectric surrounding said at least one carbon nanotube.

11. The hybrid semiconductor structure of claim 1 wherein said at least one carbon nanotube comprises a single walled carbon nanotube, a multi-walled carbon nanotube or an array of carbon nanotubes.

12. A hybrid semiconductor structure comprising:
at least one horizontal semiconductor device and at least one vertical carbon nanotube transistor including at least one vertically grown carbon nanotube. a first horizontally oriented gate electrode located within a first dielectric and a second horizontally oriented gate electrode in contact with an upper portion of the at least one vertically grown carbon nanotube and located atop said first dielectric, wherein said at least one vertical carbon nanotube transistor and the at least one horizontal semiconductor device have at least one shared node and said at least one vertical carbon nanotube is located above and laterally spaced apart from said at least one horizontal device.

13. The hybrid semiconductor structure of claim 12 wherein said at least one horizontal semiconductor device is a field effect transistor (FET), a bipolar transistor, a double gate transistor, a diode, a capacitor, a resistor or any combination thereof.

14. The hybrid semiconductor structure of claim 12 wherein said at least one horizontal semiconductor device is a pFET and said at least one vertical carbon nanotube transistor is an n-type transistor.

15. The hybrid semiconductor structure of claim 12 wherein said at least one horizontal semiconductor device is an nFET and said at least one vertical carbon nanotube transistor is a p-type transistor.

16. The hybrid semiconductor structure of claim 12 wherein said at least one shared node is a drain, source or gate electrode of said at least one horizontal semiconductor device.

17. The hybrid semiconductor structure of claim 16 wherein said at least one shared node is the gate electrode of said at least one horizontal semiconductor device.

18. The hybrid semiconductor structure of claim 16 wherein said at least one shared node comprises the drain and said gate electrode of said at least one horizontal semiconductor device.

19. The hybrid semiconductor structure of claim 12 wherein said at least one vertical carbon nanotube transistor further comprises a gate dielectric surrounding said at least one carbon nanotube.

20. The hybrid semiconductor structure of claim 12 wherein said at least one carbon nanotube comprises a single walled carbon nanotube, a multi-walled carbon nanotube or an array of carbon nanotubes.

* * * * *